Feb. 25, 1958 R. W. SORENSEN 2,825,036

LUG STRUCTURE FOR PRINTED CIRCUITS

Filed Feb. 15, 1954

INVENTOR.
Readar W. Sorensen
BY.
Robert L. Kahn
Atty.

United States Patent Office 2,825,036

Patented Feb. 25, 1958

2,825,036

LUG STRUCTURE FOR PRINTED CIRCUITS

Readar W. Sorensen, Arlington Heights, Ill., assignor to Oak Mfg. Co., Chicago, Ill., a corporation of Illinois Application February 15, 1954, Serial No. 410,345

5 Claims. (Cl. 339—17)

This invention relates to a lug structure for printed circuits and is particularly adapted for use in electric switches associated with printed circuits.

Printed circuits are well known and widely used and comprise thin copper or metalized circuit elements applied to insulating material as a backing support. In particular, printed circuits on self-supporting insulating members, such as Bakelite or the like having sufficient thickness to be mechanically strong, are used in such devices as television receivers, radio receivers and many other apparatus where complex circuitry is involved. The term "printed circuit" includes the construction previously described, although this construction may be obtained in a number of ways. Inasmuch as the formation of the printed circuit itself is no part of the present invention, no description of the manner in which the printed circuit is created is deemed necessary.

In the use of printed circuits, it is essential in many instances to effect switching of various parts of the printed circuit or of various separate components such as condensers and resistors to the printed circuit. Up to date, considerable difficulty has been occasioned in making connections between switch contacts and desired parts of a printed circuit. One of the virtues of a printed circuit is the fact that much individual hand soldering is eliminated. To maintain this advantage, various expedients for soldering contacts to parts of printed circuits have been adopted. It has been the aim of the art to prepare the various connections for soldering and then dip-solder the entire collection of connections.

Lug constructions of the prior art have not been effective for use with printed circuits for a number of reasons. For one thing, the mechanical retention of the lug in the insulating backing of the printed circuit has usually been faulty so that a substantial strain upon the soldered joint has resulted. Inasmuch as the metal used in printed circuits is quite thin, such joints have frequently given way under strain or vibration. Where a definite pattern of switch contacts on a separate switch insulating support is to be aligned with apertures in the insulating backing for the printed circuit, it has happened that some misalignment occurs with the result that either no joint or a poor joint will be provided in many instances.

This invention provides a lug construction for use with printed circuits whereby effective soldering of terminals or contacts to the printed circuits is possible with a minimum of difficulty. The construction embodying the present invention is advantageous in that each lug is inherently initially tensioned into proper contacting position with the printed circuit copper and is thus ready for soldering. A further advantage of the construction embodying the present invention resides in the fact that the strong insulating backing material for the printed circuit functions to support the lug and reduces or eliminates the mechanical strain on the soldered joint.

The new construction of the lug has an additional advantage in that the lug is so shaped as to eliminate the tendency of acid or solder to creep along the surface of the lug and reach the terminal or switch contact portion. Other and desirable advantages will occur to those skilled in the art after the invention has been disclosed.

Referring therefore to the drawings, there is shown an example of a construction embodying the invention, it being understood, however, that variations of this construction are possible without departing from the scope of the invention except as defined by the appended claims.

Figure 1 is a detail of part of a printed circuit having a switch section to which the invention may be applied.

Figure 1*a* is a detail of a sliding switch operating member with the bias spring removed.

Figures 1, 1A, 2, 3, 4, 5:
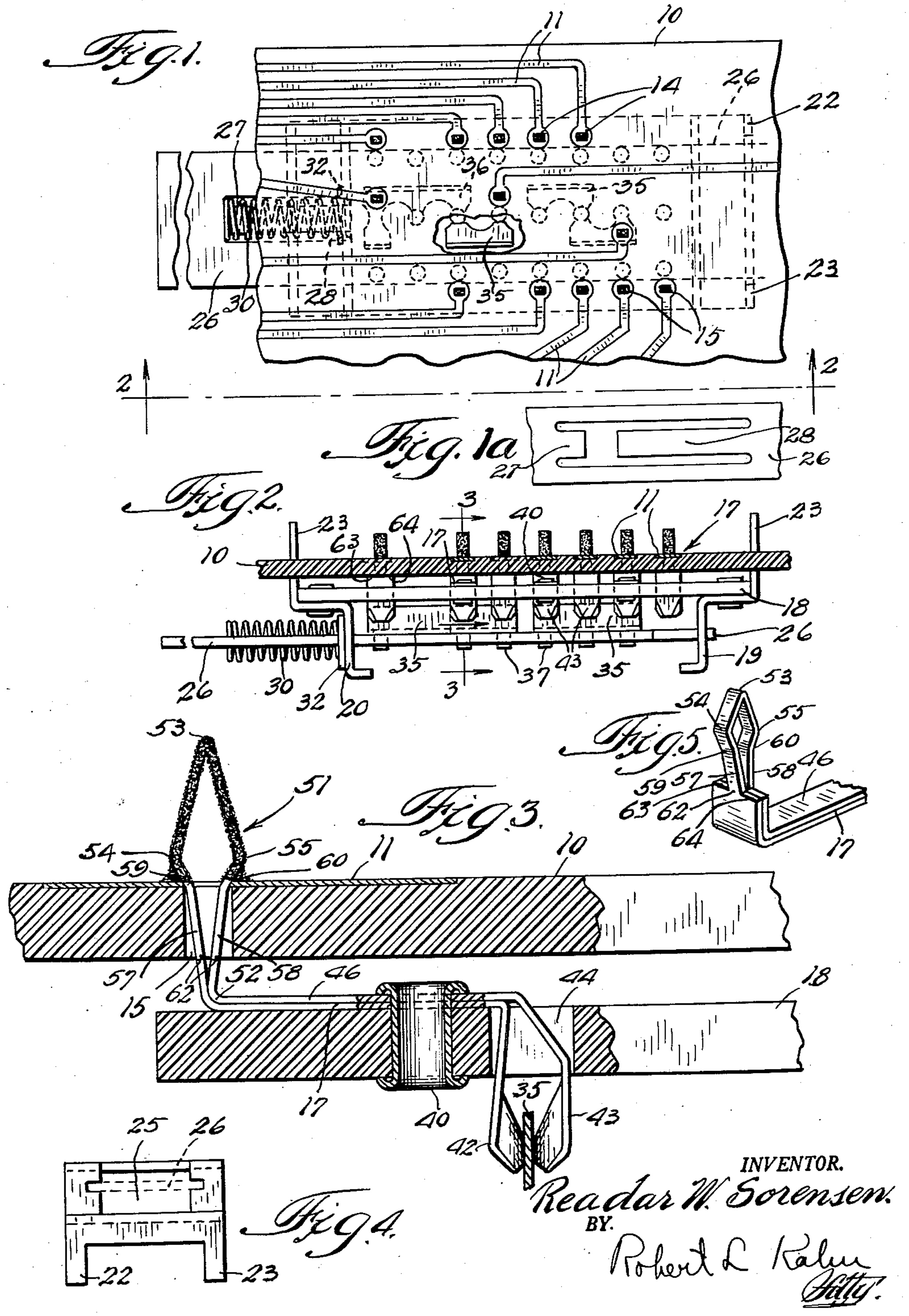
Figure 2 is a section along line 2—2 of Figure 1.
Figure 3 is a sectional detail on line 3—3 of Figure 2.
Figure 4 is a detail of a supporting piece on the switch.
Figure 5 is an isometric view of a lug embodying the present invention.

The printed circuit may comprise sheet 10 of suitably rigid insulating material, such as Bakelite or any other material having the desired mechanical and electrical properties. Sheet 10 in practice may have a thickness of the order of about $\frac{1}{16}$ of an inch, although the thickness is not important and will usually be governed by what is readily available on the market. Sheet 10 has applied thereto copper layer 11 of desired configuration and extent forming circuit components or connections for a printed circuit. Copper layer 11 may either be forced into the surface of the plastic to be flush with the plastic, or may be on the surface as desired. In any event, however, the printed circuit will have one or more locations 14 where an external connection is to be provided, such as for example to a switch contact.

As illustrated in Figure 3, the location for a switch contact is indicated by apertures 15 extending through both the copper of the printed circuit and the insulating material of backing 10. Apertures 15 are preferably rectangular and have desired length and width to accommodate the soldering lug of the contact. The copper extends to the edges of the apertures.

A contact generally indicated by 17 may be a stationary contact of any desired switch having a switch insulating base or support 18. The switch construction itself may assume a wide variety of forms and the switch may be either of the rotary type or the slide type. An example of a rotary switch with which the invention may be used is illustrated in United States Patent No. 2,186,949, issued January 16, 1940. An example of a slide switch with which the invention may be used is illustrated in Patent No. 2,196,433, issued April 9, 1940. As many stator and movable contacts may be provided as are necessary and the number and pattern of the contacts are independent of the present invention and form no part thereof. The lug embodying the invention may be part of a stationary contact or part of a connecting terminal going to a movable switch contact or to any terminal. For convenience, the entire part containing the lug will be termed a contact.

In the drawing there is illustrated a simple slide switch adapted to be attached to and used with a printed circuit. The switch comprises insulaitng support 18 carrying metal end pieces 19 and 20. Pieces 19 and 20 may be attached to support 18 by eyelets, rivets, or any other suitable means. Pieces 19 and 20 are designed to locate switch support 18 with reference to insulating sheet 10 of the printed circuit. These two pieces are designed to provide a slidable support for the movable part of the switch.

Pieces 19 and 20 are similar and are each provided with projections 22 and 23 adapted to pass through registering apertures in sheet 10 of the support for the printed circuit. Projections 22 and 23 are long enough to provide an initial registering means for locating the entire switch on sheet 10 and prevent any substantial movement of the switch along sheet 10. Projections 22 and 23 are longer than the lugs to be described so that projections 22 and 23 may be correctly located before the lugs engage the printed circuit member. Means for anchoring projections 22 and 23 in sheet 10 may be provided if desired.

Switch support 18 carries a number of stationary contacts generally indicated by 17 (Fig. 2). Pieces 19 and 20 of the switch have suitable cut-outs 25 (Fig. 4), and are adapted to slidably support insulating movable member 26 of any suitable shape. Member 26 has an interior portion cut out to provide two alined fingers 27 and 28 (Fig. 1*a*) whose opposite ends are spaced. Within the cut-out and around fingers 27 and 28 there is disposed coil spring 30 for biasing insulating member 26 to the left-hand position as seen in Figures 1 and 2.

Insulating member 26 is long enough so that in any position of the switch, the slots in cut-out portion 25 in the end pieces will slidably support the insulating member. The cut-outs in end pieces 19 and 20 are so shaped that insulating member 26 may be inserted or removed from the switch by first removing coil spring 30 and then cocking the insulating member and removing the same from the support.

An auxiliary metal washer plate 32 is provided to cooperate with piece 20 so that coil spring 30 will not extend through cut-out 25. The particular arrangement of switch support 18 and movable insulating member 26 forms no part of the present invention and it is to be understood that other slide switches or, indeed, other types of switches may be used equally well.

Insulating member 26 carries a number of movable contacts 35 extending upwardly therefrom toward insulating support 18. Movable contacts 35 are generally striaght along the length of insulating piece 26. The length and arrangement of movable contacts 35 will depend upon the number and arrangement of the fixed contacts of the switch and the desired switching action. As shown in Figure 1, movable contact 35 has attaching part 36 with rivets 37 retaining the movable contact on movable insulating member 26. The movable contact may have a section shaped like a right angle or a U, depending upon whether one or two upwardly extending contact portions 35 are desired.

As illustrated in Figure 3, insulating support 18 carries switch contact 17 suitably secured thereto. The number and positions of switch contacts may be varied depending upon individual requirements and are independent of the present invention. Contact 17 is carried by insulating support 18 and may be attached thereto in any particular manner as, for example, by eyelet 40. However, rivets, staking or any other means may be used for effecting attachment. Although a rigid support for contact 17 is shown, the invention permits a mounting with some limited movement of the contact.

Contact 17 has a pair of contact jaws 42 and 43 of any desired shape, the jaws opposing each other and being adapted to cooperate with contact blade 35. It is understood that contact blade 35 will be moved in such a direction as to permit the blade to knife between the jaws. The shape of the movable and stationary contacts may be varied within wide limits. The movable contact or contacts may float and bridge stationary contacts or the movable contact may be supported on a contact carrying arm requiring separate electrical connections thereto from the printed circuit.

Stationary contact 17 is preferably formed of spring material, such as spring brass or Phosphor bronze, and may be silver plated for desirable contact action. Inasmuch as printed circuits are generally used with high frequency currents, a silver plate upon the surface of the contacts will generally suffice to reduce the ohmic resistance of the contact as well as impart desirable contact characteristics for corrosion and the like.

Contact jaws 42 and 43 extend through suitable aperture 44 in insulating support 18. Contact 17 has body portion 46, where the contact is attached to insulating suport 18. Body portion 46 has two thicknesses of metal and the two thicknesses of metal preferably extend from eyelet 40 to the lug portion to be described. Body portion 46 of the contact extends generally parallel to the faces of insulators 18 and 10. As illustrated, body 46 is spaced from insulating sheet 10 and is disposed against the face of insulator support 18.

Body 46 continues as a lug generally indicated by 51, this lug being bent sharply from body 46 at 52. Lug 51 when viewed from the edge of the metal as illustrated in Figure 3, for example, has the general shape of a diamond with portions 52 and 53 located at the ends of the major axis and portions 54 and 55 located at the ends of the minor axis. The major axis of the diamond is somewhat greater than twice the thickness of the printed circuit backing, in this instance sheet 10.

As is clearly evident in Figure 3, less than one-half of the lug between portion 52 and the minor axis, referred to for convenience as the inner half of the lug, in the assembled position of the contact lies within the thickness of sheet 10. The lug is long enough along its major axis so that the minor axis, when the lug is properly disposed in position on the printed circuit, lies beyond the outer face of the printed circuit, this being the face carrying the circuit proper, as copper 11.

Preferably, though not necessarily, sides 57 and 58 of the diamond shaped lug, forming the diamond sides of the inner half, are bent out of line at 59 and 60 respectively near the minor axis. Diamond sides 57 and 58 are bent inwardly so that from lines 59 and 60 toward points 54 and 55, the sides of the diamond flare outwardly even more than would have been the case if the sides of the diamond had been straight. The shapes of sides 57 and 58 need not necessarily be as shown but may be curved inwardly. Beyond the minor axis toward end 53 of the lug, this being the outer half of the diamond, the diamond sides may be straight as shown, or may have some curvature.

As illustrated in Figure 2, the width of the lug, i. e. the dimension of the metal perpendicular to the paper as seen in Figure 3, is reduced at 62 near lug portion 52. The lug is so designed that the distance between 62 and the minor axis is somewhat greater than the thickness of insulating sheet 10. The lug has shoulders 63 and 64 formed at 62, the metal from these shoulders to lug tip 53 being narrower than the lug portion between 62 and bent portion 52. Aperture 15 in sheet 10 has such a dimension that shoulders 63 and 64 will engage sheet 10 while the reduced lug is insertable. The lug design factors will be explained later.

As is readily apparent, a lug may be forced through aperture 15 of the printed circuit by compacting the diamond to shorten its minor axis and permit parts 54 and 55 to squeeze through sheet 10 and be disposed on the outside thereof. When the lug has passed through sheet 10, as illustrated in Figure 3, the spring of the metal tends to expand the diamond to its normal shape. The diamond sides near the minor axis on the inside half of the lug will engage the edges of the copper at aperture 15.

The thickness of printed circuit sheet 10 may be varied within limits without changing the dimensions of the lug. By proper choice of the various lug dimensions as compared to the thickness of sheet 10, as well as gauge of lug metal, a lug as illustrated in Figure 3 will have a tendency to lock itself in position. Shoulders 63 and 64 engage the inside face of insulating sheet 10 due to the outward flare of the lug near the minor axis.

To assemble a switch and a printed circuit, the entire switch unit, containing insulating support 18 and the various contacts, is positioned so that metal fingers 22 and 23 of the end pieces will register with and enter the appropriate apertures in printed circuit insulating sheet 10. As has been previously pointed out, fingers 22 and 23 are long enough so that this initial locating of the switch assembly with reference to the printed circuit may be accomplished while lug tips 53 of the contact clips are short of insulating sheet 10.

Assuming that all the contact clips have their free lug tips 53 just entering the corresponding apertures in sheet 10—precise alignment is obviously not necessary—further pressure on switch assembly 18 with reference to printed circuit sheet 10 is provided. The clearance between fingers 22 and 23 of the end pieces of the corresponding apertures in sheet 10 will permit the entire switch assembly to adjust itself so that the various lugs may be sprung through the printed circuit backing to the final position as illustrated in Figure 3. In this position, the lugs in a switch having a large number of contacts will provide a cumulative retaining force which is quite substantial.

The spring of the lugs will be sufficient to permit individual lugs to align themselves within the respective apertures in sheet 10 so that every lug will substantially assume the position shown in Figure 3. Thereafter the assembly of printed circuit and switch may be disposed over a pan of molten solder so that the lugs dip into the molten solder. The depth of penetration of the lugs into the solder may vary, although it is to be understood that the printed circuit surface will be kept clear of the surface of the solder.

The liquid solder will climb along each lug by way of the diamond sides from the solder level to the copper edges at apertures 15. Solder will flow from the lug to copper 11 of the printed circuit, the solder forming a fillet between the adjacent lug metal and copper 11. In some instances, depending upon how long the lug is immersed in the solder, the solder may even travel beyond the outer face of the printed circuit, i. e. beyond copper 11, and along the lug part within aperture 15. The shoulders provide such an extended area that they may be considered to be the limit of solder travel under all conditions. In general the solder travel will be short of the shoulders. This is also true of any acid into which the lugs may have been dipped prior to soldering.

As illustrated in Figure 3, the fuzzy showing over the part of the lug from the printed circuit face 11 to tip 53 indicates a coating of solder. The soldered lugs after cooling are stiffened substantially by the solder layer. The joint between the lug and copper 11 of the printed circuit will be strong.

The contact members and lugs may be made in any desired sizes. Contact lugs having different size contact jaws may be used. While the lug shown has the minor axis crossing the major axis perpendicular thereto and approximately at the mid-point, variations in dimensions are possible so that the parts of the diamond on the two sides of the minor axis need not necessarily be equal and the diamond itself need not necessarily be symmetrical.

In general, however, the lug portion should be of spring metal and have a collapsible generally diamond shaped part. The lug should also have most of the free diamond portion of reduced width as compared to the inner end of the diamond (the end joining the body portion) to provide shoulders. The thickness of sheet 10 should be such that when suitably apertured, the wedging action of the compressed diamond retains the shoulders tightly against the insulating sheet.

In general, the minor axis of the diamond and the angle forming the diamond corner at each end of the minor axis should be so designed that a lug may be sprung expeditiously through insulating sheet 10. The springing of the lug through sheet 10 may be facilitated by having aperture 15 taper with penetration along the dimension parallel to the minor axis, aperture 15 being narrower at the outer face containing copper 11. In general, the thickness of sheet 10 is small so that tapering the walls of aperture 15 will not be important.

While the lug illustrated in the drawings has shoulders 63 and 64, these shoulders may be omitted or the lug width may be constant rather than reduced. In such case, end pieces 19 and 20 are shaped so that the body thereof will engage the inner face of sheet 10 and cooperate therewith to act as stops. Thus the integrated spring pressure of the various diamond shaped lugs will pull the entire switch assembly toward sheet 10 until the end pieces stop further travel.

As has been previously pointed out, the diamond or arrow headed part of the lug cooperates with shoulders 63 and 64 of the lug to maintain the lug tightly in position on insulating sheet 10. It is possible to have the lug metal of constant width or shaped as to eliminate shoulders 63 and 64. The spring of the diamond shaped part of the lug would ordinarily tend to pull the lug through without any part of the lug wedging against the inside face of insulating sheet 10. A wedging action for all switch lugs may be obtained by the action of the body of end pieces 19 and 20. Projections 22 and 23 of the end pieces extend from the body thereof and this body may be designed so that an entire switch section will be retained in position by the body of end pieces 19 and 20 engaging the opposed inside face of insulating sheet 10. Thus the accumulated spring of all of the lugs will pull the switch so that the body portions of end pieces 19 and 20 will engage sheet 10. The dimensions of projections 22 and 23 extending from the body of pieces 19 and 20 must be designed with reference to the dimensions of the lugs so that the shoulders on end pieces 19 and 20 may be substituted for the shoulders on the lugs.

As illustrated, end pieces 19 and 20 also cooperate with the shoulders on the lugs to retain the lugs locked in the printed circuit. It is thus clear that the lugs on the shoulders alone may be used for engaging the inside surface of sheet 10 without reference to any shoulder action on pieces 19 and 20; the shoulders on pieces 19 and 20 alone may be relied upon without reference to shoulders 63 and 64 on the lugs; and the shoulders on both the lugs and the end pieces may be relied upon for joint action.

What is claimed is:

1. A contact for direct mounting upon an insulating panel carrying printed circuitry at apertures through the insulation and printed circuit, said contact being of flat, spring strip metal doubled across a transverse line at a tip and having a body portion and lug portion, said tip being on the lug portion, the lug portion being narrower than the body portion to form stopping shoulders at the junction of the lug and body portions, the body portion having the two metal thicknesses in contact, the lug portion having the metal layers spread so that from the edges of the metal, the lug has the general shape of a diamond with the long or major axis of the diamond extending from the tip to the stopping shoulders, the minor axis being substantially shorter than the major axis, the lug portion being symmetrical with respect to the major axis, and, the contact being adapted to be sprung through apertures which will accommodate the lug only when flattened to shorten the minor axis, the shoulders limiting the contact insertion and the panel thickness being small enough so that the lug from the minor axis to tip will be beyond the panel.

2. The construction according to claim 1 wherein the lug parts between the shoulders and minor axis which would normally lie within the panel thickness after mounting are bent toward each other so that the diamond corners at the ends of the minor axis overlie the printed circuit adjacent the aperture edges.

3. The construction according to claim 2 wherein said body portion has an aperture therethrough at a region remote from the shoulders whereby the contact may be secured to a support member.

4. The construction according to claim 3 wherein the body portion carries spring contact jaws at the free ends thereof.

5. The construction according to claim 4 wherein the lug portion and contact jaws are bent away from the body portion so that edgewise the entire construction has a general Z shape.

References Cited in the file of this patent

UNITED STATES PATENTS

| | | |
|---|---|---|
| 2,520,725 | Judd | Aug. 29, 1950 |
| 2,593,479 | Niefer | Apr. 22, 1952 |
| 2,658,182 | Jackson et al. | Nov. 3, 1953 |
| 2,718,625 | Harrison | Sept. 20, 1955 |
| 2,741,751 | Weiler | Apr. 10, 1956 |
| 2,742,627 | Lazzery et al. | Apr. 17, 1956 |
| 2,747,169 | Johanson | May 22, 1956 |